(12) United States Patent
Lee et al.

(10) Patent No.: US 11,133,218 B1
(45) Date of Patent: Sep. 28, 2021

(54) SEMICONDUCTOR APPARATUS HAVING THROUGH SILICON VIA STRUCTURE AND MANUFACTURING METHOD THEREOF

(71) Applicants: Tae Young Lee, Seoung Nam (KR); Youn Tak Park, Yong In (KP)

(72) Inventors: Tae Young Lee, Seoung Nam (KR); Youn Tak Park, Yong In (KP)

(*) Notice: Subject to any disclaimer, the term of this patent is extended or adjusted under 35 U.S.C. 154(b) by 7 days.

(21) Appl. No.: 16/750,909

(22) Filed: Jan. 23, 2020

(51) Int. Cl.
*H01L 21/768* (2006.01)
*H01L 23/48* (2006.01)
*H01L 23/532* (2006.01)
*H01L 21/02* (2006.01)

(52) U.S. Cl.
CPC .... *H01L 21/76897* (2013.01); *H01L 21/0206* (2013.01); *H01L 21/02068* (2013.01); *H01L 21/76834* (2013.01); *H01L 21/76852* (2013.01); *H01L 21/76873* (2013.01); *H01L 21/76879* (2013.01); *H01L 23/481* (2013.01); *H01L 23/53238* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,159,851 A * | 12/2000 | Chen | ................. | H01L 21/76843 438/669 |
| 6,259,160 B1 * | 7/2001 | Lopatin | ............. | H01L 21/76801 257/750 |
| 6,962,873 B1 * | 11/2005 | Park | ........................ | C23C 18/50 257/E21.174 |
| 10,163,695 B1 * | 12/2018 | Joi | .......................... | C23C 18/48 |
| 2003/0098241 A1 * | 5/2003 | Homma | .................... | C25D 5/22 205/206 |
| 2006/0280860 A1 * | 12/2006 | Paneccasio, Jr. | ........ | C23C 18/50 427/99.5 |
| 2007/0166982 A1 * | 7/2007 | Preusse | ............. | H01L 21/76856 438/597 |
| 2008/0090414 A1 * | 4/2008 | Chen | ....................... | C23C 18/50 438/678 |

(Continued)

FOREIGN PATENT DOCUMENTS

| WO | PCT/FR03/050036 | 3/2004 |
|---|---|---|
| WO | PCT/FR03/050037 | 3/2004 |

(Continued)

*Primary Examiner* — Mamadou L Diallo
(74) *Attorney, Agent, or Firm* — Sandy Lipkin

(57) ABSTRACT

A semiconductor apparatus having through silicon via structure and a manufacturing method thereof to enable the significant process and cost reduction and the improvement of performance of through silicon via by forming barrier and seed metal layers with electroless plating, the barrier layer applied in forming through silicon via with wet electroless plating thereby enabling structural uniformity and improvement in electrical properties with less process cost and higher yield to meet the both performance and economic objectives. The instant invention enables the formation of TSV with smaller diameter of the opening and, if necessary, omitting the formation of copper seed layer. Direct copper plating on the barrier layer is possible and this reduces the number of processes, charges the inside of via at once through copper plating to bring more improvements in electrical properties as effect.

26 Claims, 17 Drawing Sheets

(56) References Cited

U.S. PATENT DOCUMENTS

| | | | | |
|---|---|---|---|---|
| 2008/0254205 | A1* | 10/2008 | Petrov | H01L 21/288 |
| | | | | 427/99.5 |
| 2009/0155468 | A1* | 6/2009 | Petrov | C23C 18/1617 |
| | | | | 427/306 |
| 2009/0280649 | A1* | 11/2009 | Mayer | H01L 21/3212 |
| | | | | 438/676 |
| 2015/0243553 | A1* | 8/2015 | Tanaka | C23C 18/40 |
| | | | | 438/653 |
| 2015/0247242 | A1* | 9/2015 | Iwai | C23C 18/165 |
| | | | | 427/444 |
| 2016/0099407 | A1* | 4/2016 | Lim | G11C 11/161 |
| | | | | 257/425 |
| 2016/0336179 | A1* | 11/2016 | Mizutani | C23C 18/1637 |
| 2017/0084489 | A1* | 3/2017 | Lin | H01L 21/76898 |
| 2018/0100218 | A1* | 4/2018 | Chen | C23C 18/1676 |
| 2018/0350672 | A1* | 12/2018 | Shusterman | H01L 23/53223 |

FOREIGN PATENT DOCUMENTS

| | | |
|---|---|---|
| WO | PCT/FR03/050042 | 3/2004 |
| WO | PCT/FR04/050057 | 9/2004 |
| WO | PCT/FR04/003018 | 6/2005 |
| WO | PCT/FR05/000693 | 10/2005 |
| WO | PCT/FR06/001355 | 1/2006 |
| WO | PCT/FR06/050914 | 3/2007 |
| WO | PCT/FR06/050915 | 3/2007 |
| WO | PCT/FR06/002269 | 4/2007 |
| WO | PCT/FR06/002270 | 4/2007 |
| WO | PCT/FR06/002260 | 5/2007 |
| WO | PCT/EP07/051681 | 8/2007 |
| WO | PCT/EP07/051924 | 9/2007 |
| WO | PCT/EP07/052091 | 9/2007 |
| WO | PCT/FR09/050812 | 11/2009 |
| WO | PCT/FR09/051279 | 1/2010 |
| WO | PCT/EP09/061527 | 3/2010 |
| WO | PCT/EP08/064925 | 5/2010 |
| WO | PCT/EP10/053955 | 9/2010 |
| WO | PCT/EP10/056738 | 11/2010 |
| WO | PCT/EP10/061693 | 2/2011 |
| WO | PCT/EP10/063210 | 3/2011 |
| WO | PCT/EP10/064565 | 7/2011 |
| WO | PCT/US10/062636 | 7/2011 |
| WO | PCT/US10/106255 | 7/2011 |
| WO | PCT/EP11/059581 | 12/2011 |

* cited by examiner

[Figure 1]
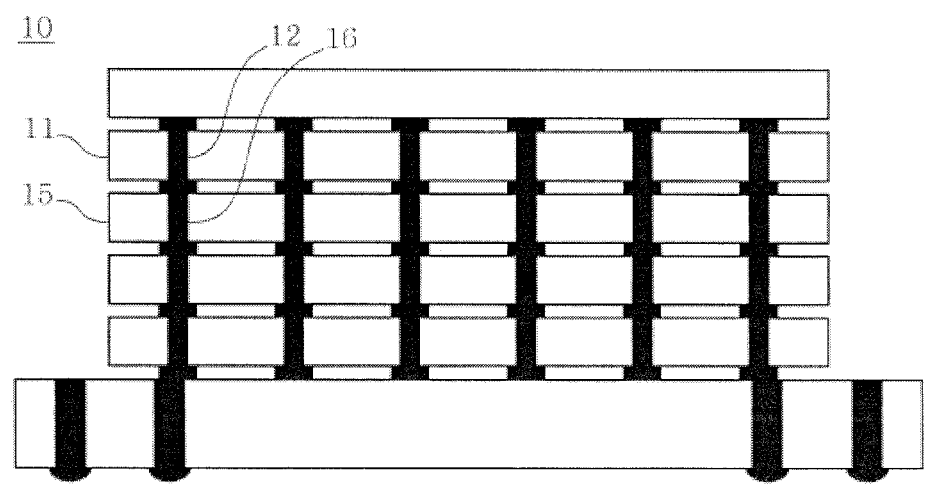

[Figure 2a]
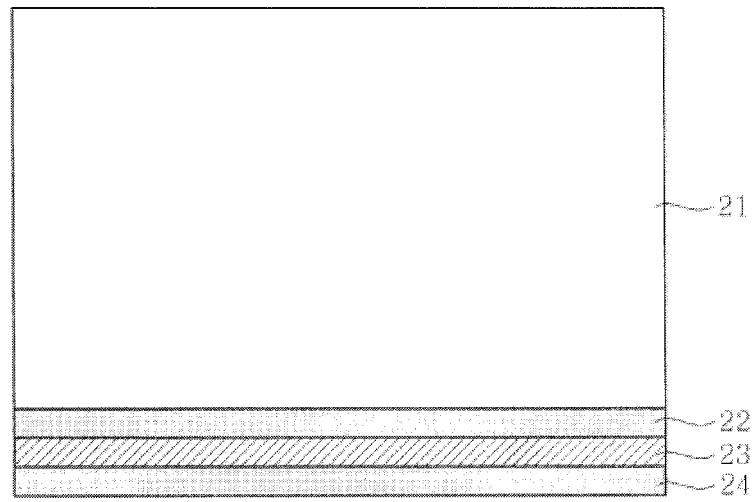
[Figure 2b]
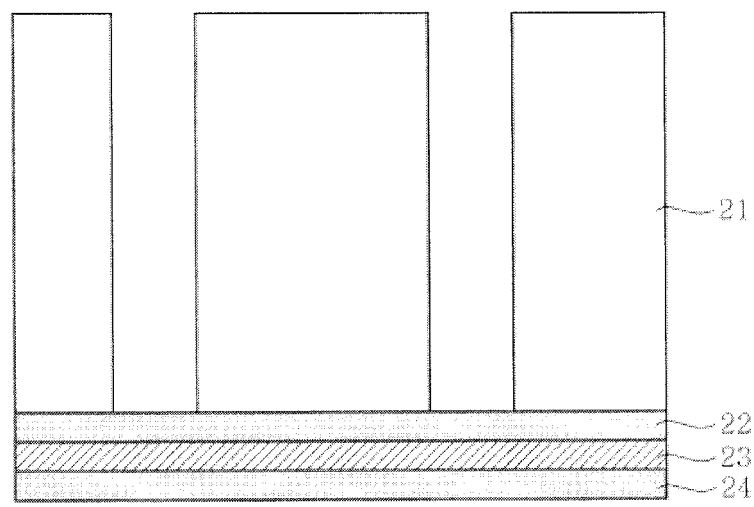

[Figure 2c]
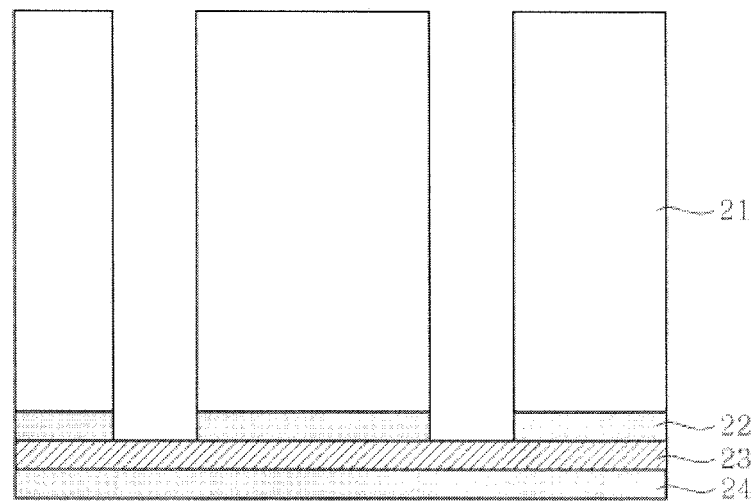
[Figure 2d]
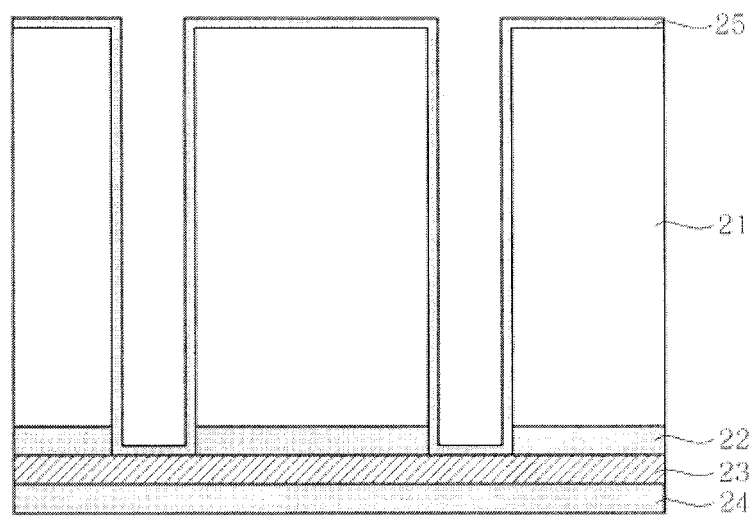

[Figure 2e]
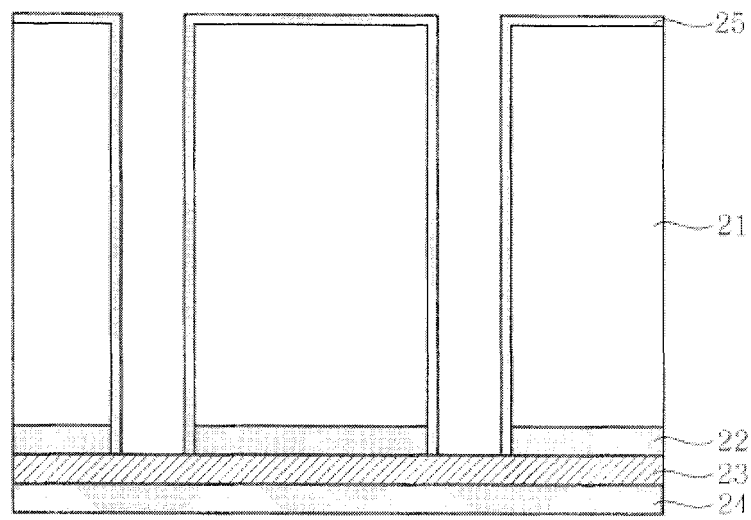
[Figure 2f]
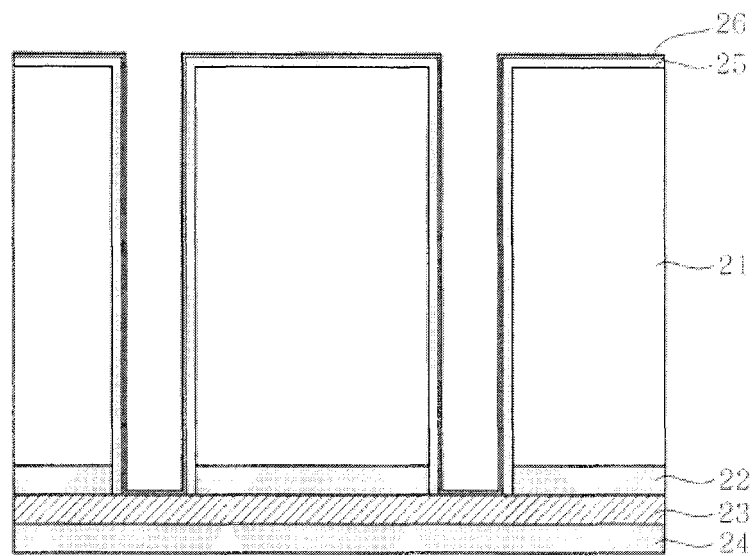

[Figure 2g]
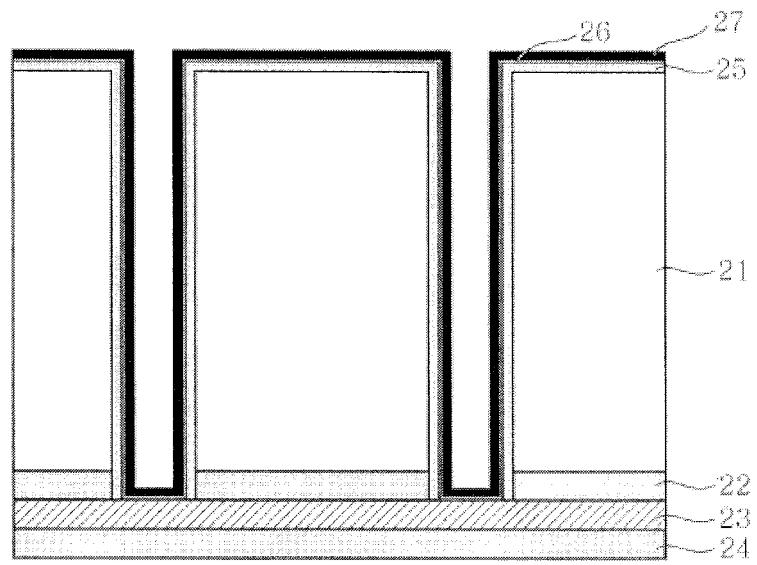
[Figure 3a]
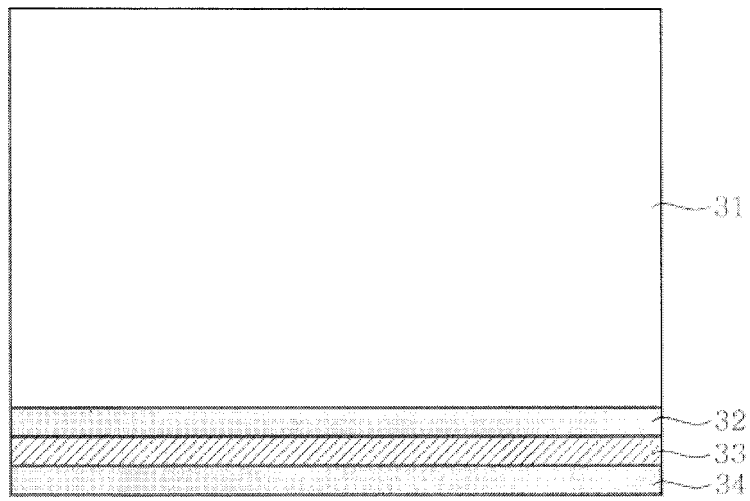

[Figure 3b]
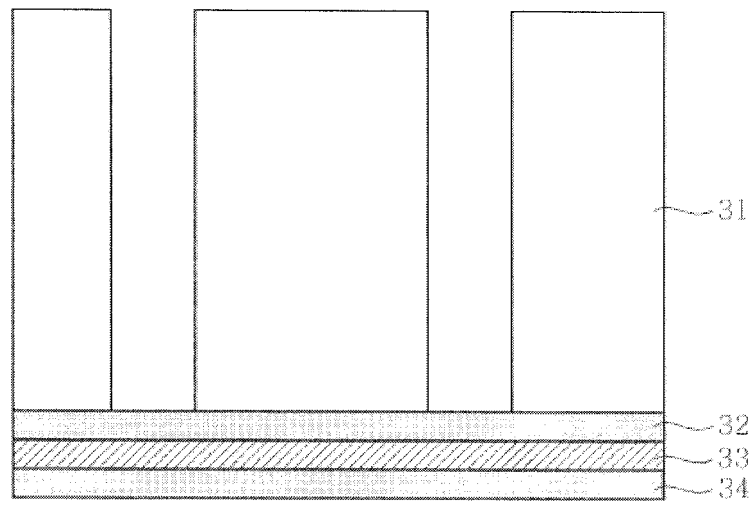
[Figure 3c]
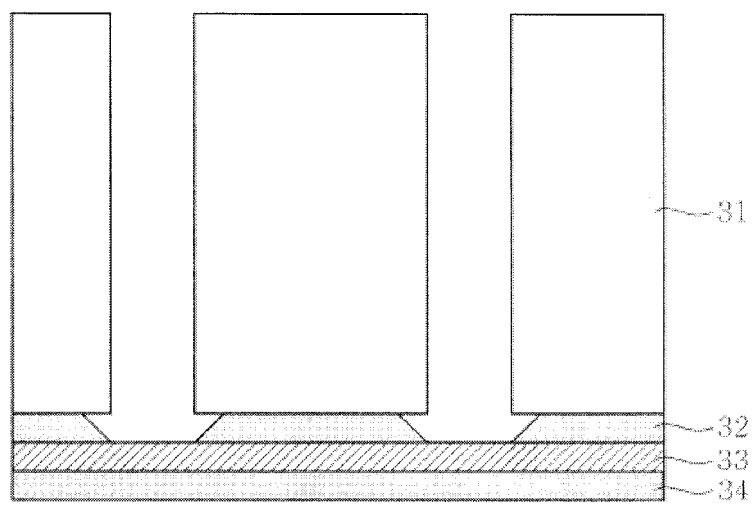

[Figure 3d]
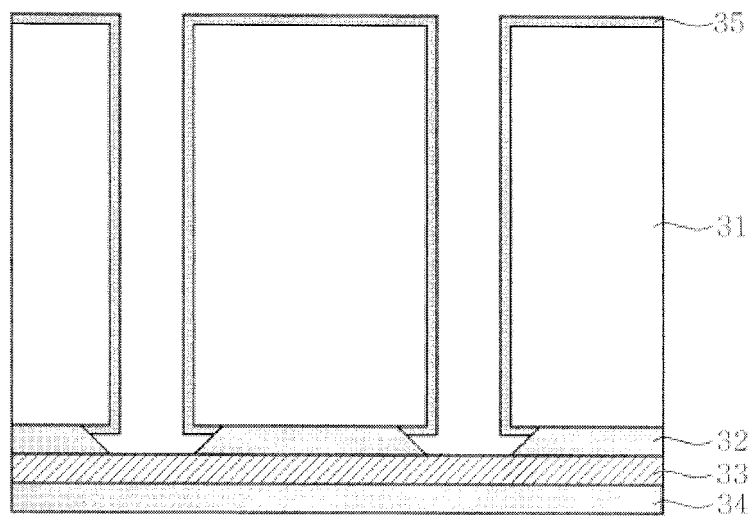
[Figure 3e]
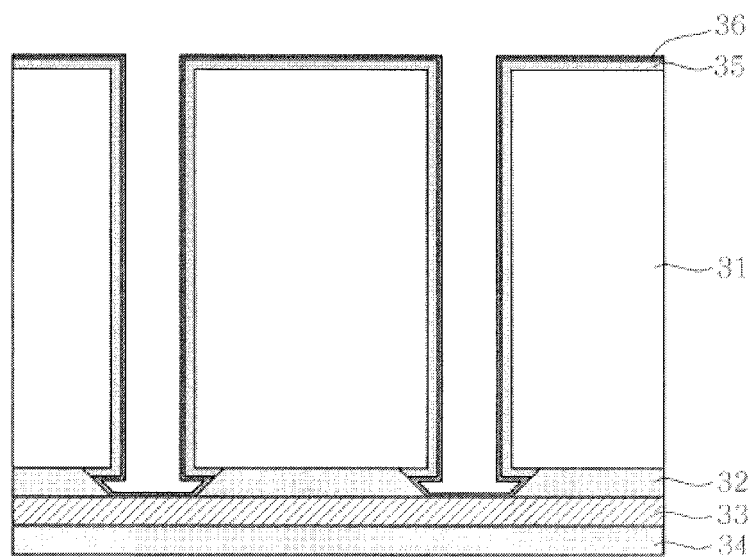

[Figure 4]
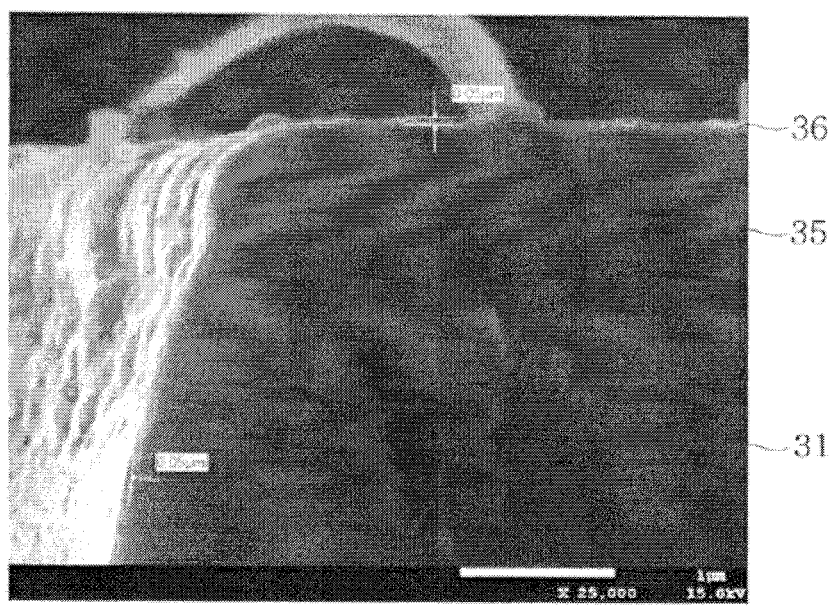

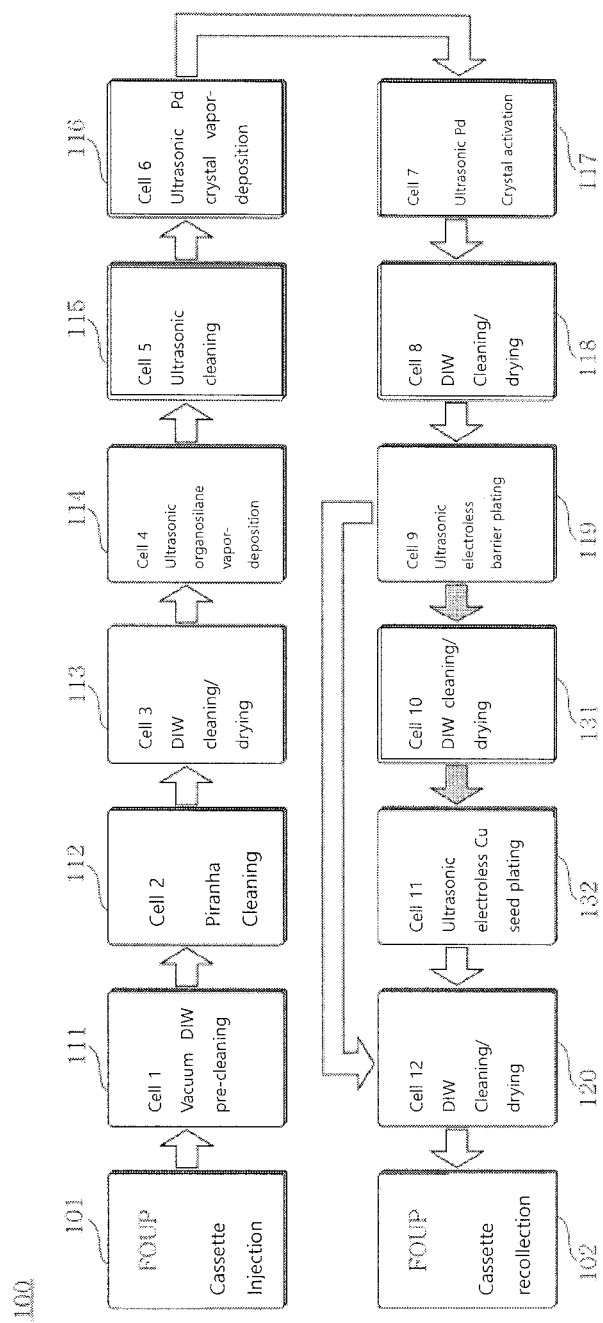
[Figure 5]

[Figure 6]
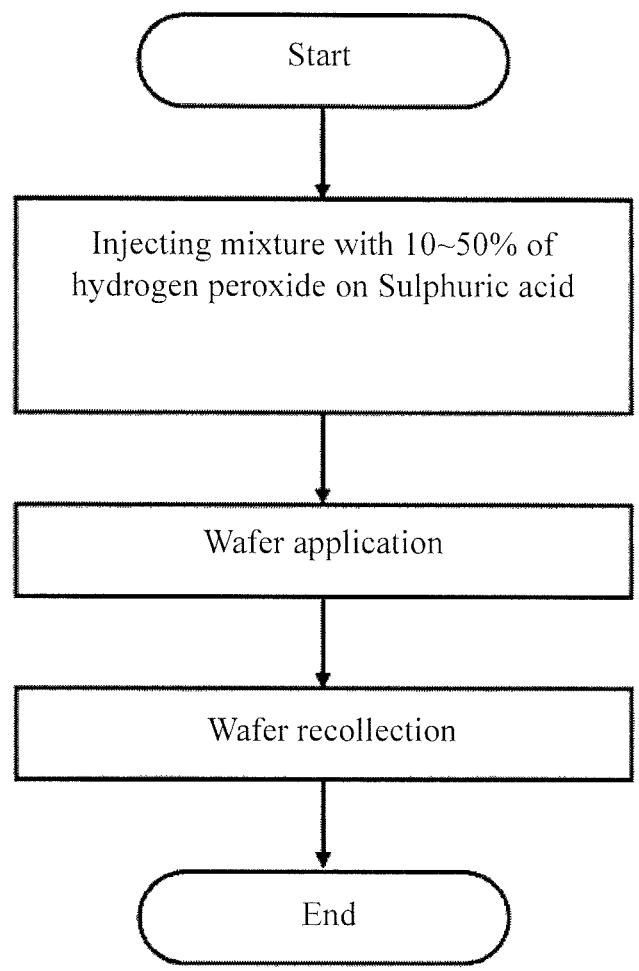

[Figure 7]
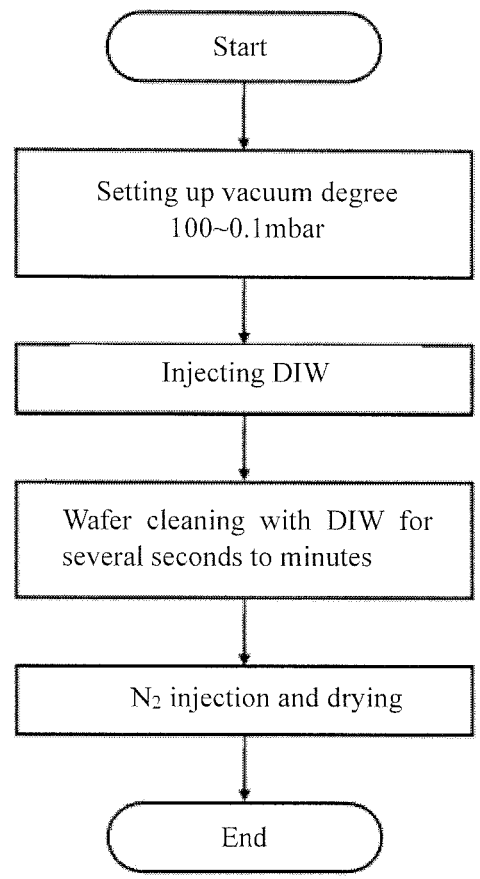

[Figure 8]
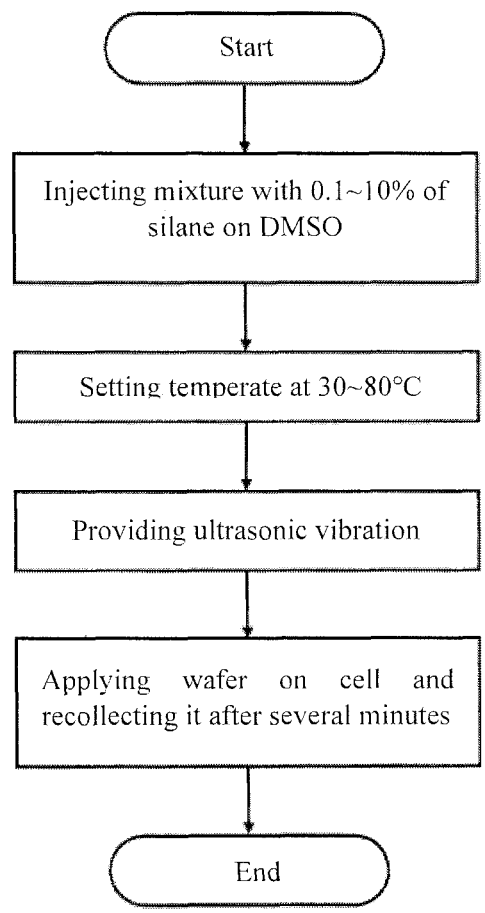

[Figure 9]
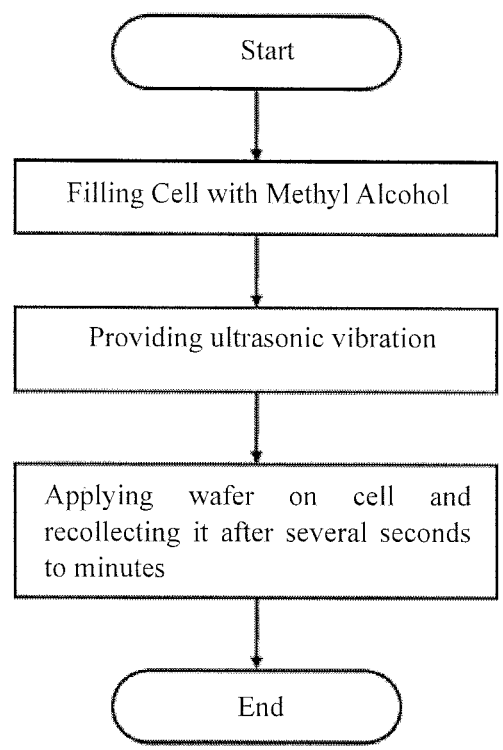

[Figure 10]
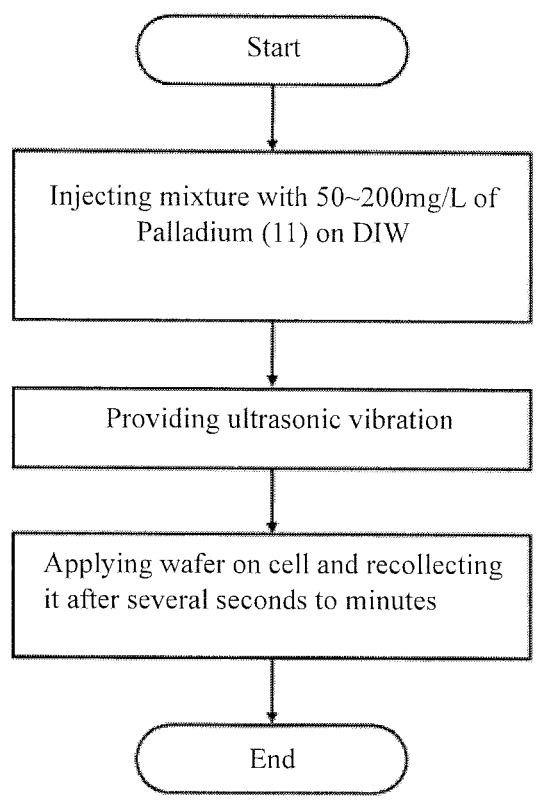

[Figure 11]
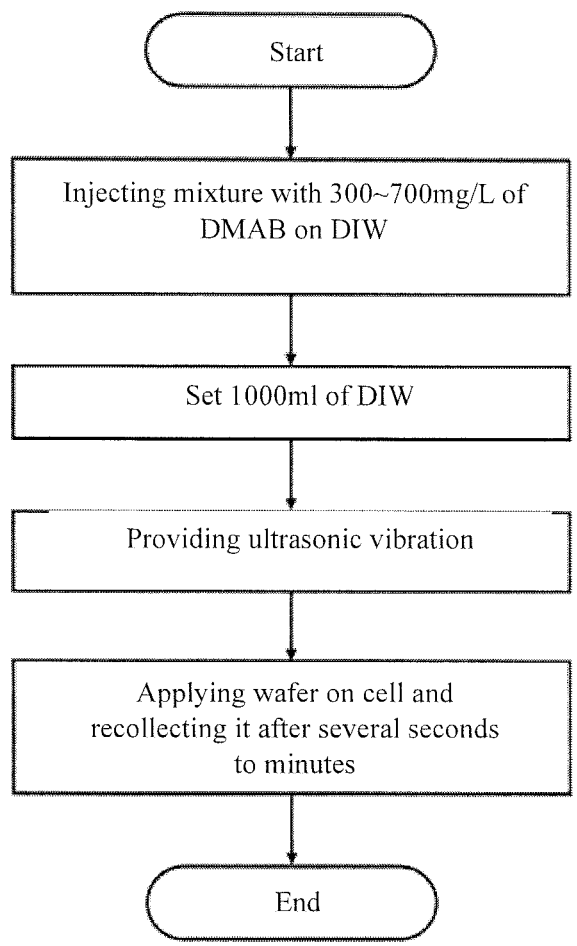

[Figure 12]
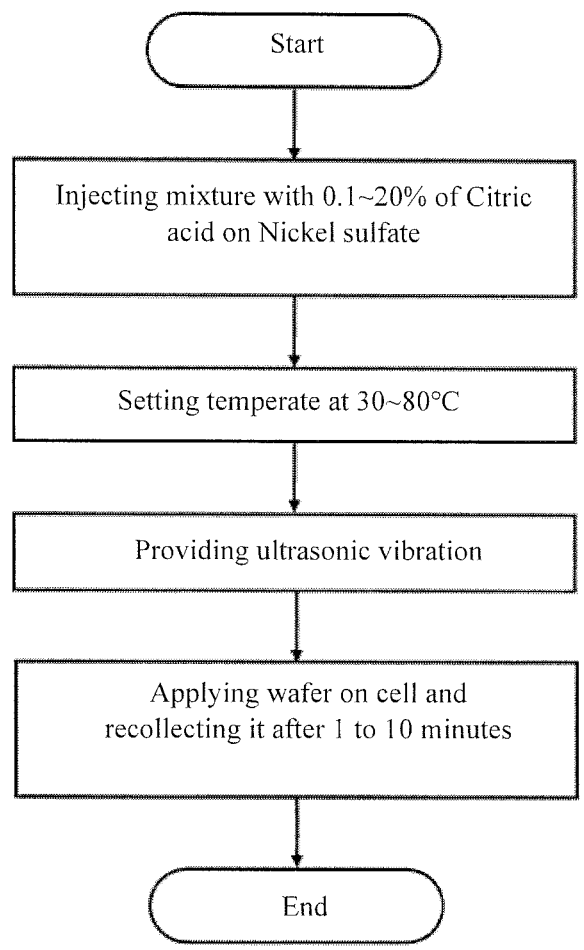

[Figure 13]
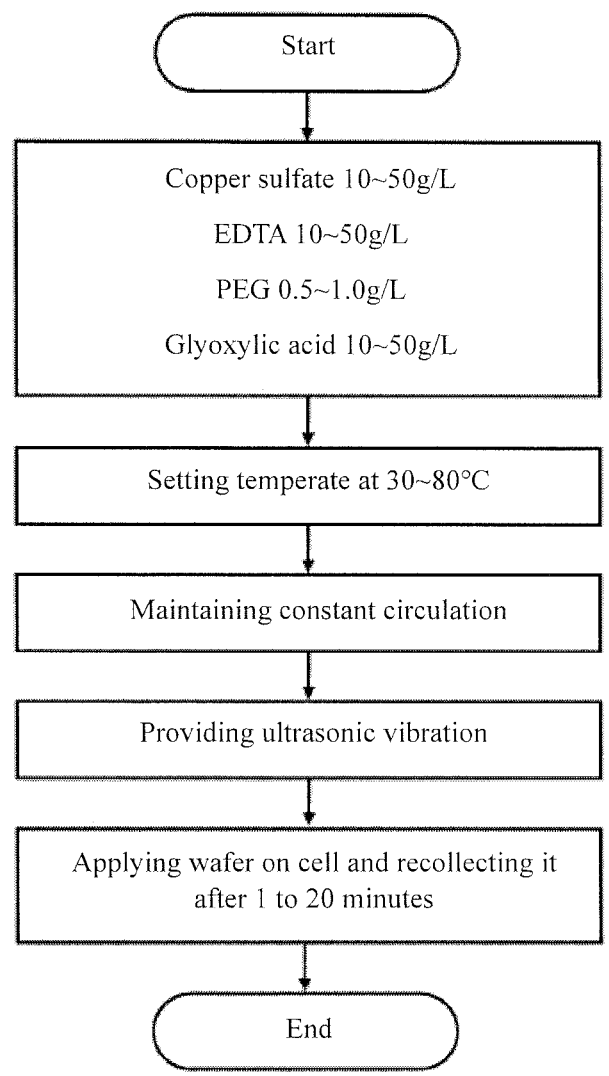

SEMICONDUCTOR APPARATUS HAVING THROUGH SILICON VIA STRUCTURE AND MANUFACTURING METHOD THEREOF

BACKGROUND OF THE INVENTION

Field of the Invention

This invention relates generally to the field of semiconductors and more particularly toward a semiconductor apparatus having through silicon via structure and a manufacturing method thereof that is produced by forming a barrier and seed layer with an electroless plating method that reduces the manufacturing cost and improves the performance of the through silicon via ("TSV").

Description of the Prior Art

The demand of smaller and better-performing parts is increasing due to the rapid growth in development of control communication technology and 3D integrated circuits that provide a higher degree of integration. These advances are attracting public attention and there is a need to meet the increasing demand in efficient and cost-effective ways. 3D integrated circuits are integrated with vertical lamination of various semiconductor chips. Wire-bonding technology or flip-chip technology are used in the industry currently for the electric wiring of these integrated chips. A drawback to these methods includes the face that these methods have comparatively longer wiring that causes a limit in gate delay which causes overall performance degradation of the final product. TSV technology, i.e., through silicon via, has become a popular solution to this problem, which allows for a reduction in electric inductance and capacitance by constructing multiple chips into a single chip through a vertical copper wire connection without wire-bonding.

TSV inserts 3D wiring within the chip, which minimizes the required length of the connecting wires that are there to reduce electric inductance and capacitance. Accordingly, the minimized size of the laminated chip is currently the hottest manufacturing trend when a process requires or desires a lighter weight and smaller size of the device or devices manufactured.

Prior art processes are illustrated in some of the attached figures. FIG. 1 is an example of the composition of a laminated chip (10) with TSV in the current state of the art. As shown in FIG. 1, the through via (12) that penetrates the whole chip (10) is built on a separate semiconductor chip (11), with the connected structure (16) between the through via (12) is built on a separate chip (15) at its lower part. This structure is repeated on all the chips. Furthermore, the lower chip (15) and the upper chip (11) may differ in size, but the laminated chip (10) can be built at a minimum size that performs complex functions by being enabled to send and receive electrical signals with minimum electrical distance by through via that are built in to each chip as shown by the figure.

TSV technology includes through via formation technology that creates certain features, such as through vias/deep trenches with high aspect ratio producing electrical properties by completely filling it with a conductive substance, such as copper and others for the inside of the formation after insulation.

Existing through via formation technology includes a process involving the formation of a via (or trench) on a wafer (or glass substrate), the construction of an insulation layer between an electrode and the wafer at the inside of the via, the formation of a barrier layer that prevents metal diffusion of the copper electrode, the vapor deposition of a copper seed layer on the barrier layer and the plating of the seed layer with copper to fill the via.

This TSV is classified as via first, via middle and via last based on the formation time. Via first is a method that forms via first, via middle produces a chip then forms a via with a post process and via last is a method to complete the TSV process after the completion of chip. Via first has to consider the post process and the limit of the filling substance in order to avoid the production of bad electrical properties. Via middle fills the chip with copper or tungsten, but tungsten has an inherent limit in the ultimate thickness of the filling, which produces a TSV with a high investment cost, but the via first and middle can reduce the diameter of TSV to provide a degree of freedom in the routing. On the other hand, via last completes the TSV process after the completion of chip, which can cause difficulty in finding the cause of any errors when they occur. However, it can be produced in a foundry without the TSV process with an improvement in electrical properties by filling up the via with copper.

Higher performance is achieved through TSV technology that fills a via with copper as via middle or last.

Existing TSV technologies are explained in FIGS. 2A and/or 2G.

In FIGS. 2A and 2G, there is shown an example of a via last that forms a TSV on a silicon substrate (21), with an insulation layer (22), a pad layer (23) and an additional insulation layer (24). In the described example, the insulation layers (22, 24) are dielectric layers with silicon oxide film ($SiO_2$), and the pad layer (23) is a metal electrode to be connected with the TSV to be formed.

The lower insulation layer (22) is exposed and a hole or trench-shaped via with high aspect ratio is formed on a silicon substrate (21) by using a deep reactive ion etching ("DRIE") process or a UV laser as seen in FIG. 2B. In the described example, a plasma etching method such as DRIE process was used to form a via.

FIG. 2C illustrates the applied and selectively etched dry etching process of the exposed insulation layer (22) through the process of exposing the lower pad layer (23). In this process, minute cracks can occur on the lower pad layer (23) by the dry etching process, and this can be a cause of the depletion of electrical properties between the TSV and the pad layer (23).

FIG. 2D illustrates a chip formed with a dielectric layer of silicon oxide film ($SiO_2$) on the side of the via for the electrical insulation of the substance filling the via after forming the via to pad layer (23) as above to provide an insulation layer (25). This dielectric insulation layer (25) applies a chemical vapor deposition ("CVD") process and most often utilizes tetraethoxysilane ("TEOS").

The formed insulation layer (25) also forms on the lower pad layer (23) of the via, and it has to be re-etched to expose the pad layer (23).

FIG. 2E illustrates a chip formed that used the dry etching process on the lower insulation layer (25) of the via to expose the lower pad layer (23). In this dry etching process, the pad layer (23) becomes re-depleted and will have lower electrical contact properties with TSV by multiple iterations of the depletion process on this pad layer (23).

FIG. 2F illustrates a chip when more barrier layer (26) is formed to prevent the diffusion of the metal used, e.g., copper, to fill the via formed on the side of the insulation layer (25) to silicon. This barrier layer is made of Ti, TiN, Ta, TaN or a combination thereof, and dry processes such as physical vapor deposition ("PVD"), ionized physical vapor deposition ("iPVD"), CVD and atomic layer deposition ("ALD"). The PVD/iPVD or CVD processes have difficulties in vapor-deposition at a 10 or higher aspect ratio and an effective cleanse of the plasma is hard to achieve at a 10 or higher aspect ratio which causes the limit in applying TSV. In the case of ALD, a high temperature process is required at 400° C. or higher, and the yield is extremely low with very high cost of process equipment which causes difficulty in mass production.

Despite these issues, currently the PVD or CVD process is chosen to form a barrier most of the time. In the PVD process intensive vapor-depositing on the opening forms a high aspect ratio due to sputtering method's properties. Thus, the vapor-deposition is not sufficiently made to the lower part or it may cause defects due to low uniformity. On the other hand, CVD process requires a 300° C. or higher temperature to remove chlorine or fluorine originating from the membrane and used as a raw material in the layer, which causes poor electrical properties due to high resistance.

Currently, copper is used to fill a via and uses electroplating. This electroplating enables effective recharging without gaps at the via with high aspect ratio and is used to fill the TSV with copper.

However, to use this electroplating in via laminating, uniformity and continuity needs to be guaranteed on the conductive substance layer formed on the surface of the inside of the via. If the conductive substance layer by electroplating doesn't have uniformity or continuity, it causes defects inside the plating layer and affects the current.

Therefore, forming a barrier layer with the current PVD/iPVD or CVD method requires a deposition in uniformity, electrical properties, etc.

FIG. 2G illustrates a chip with a copper seed layer (27) on the formed layer (26), the copper seed layer (27) is for the plating process to fill the via with copper and is normally formed through PVD/iPVD. However, it has been shown that the properties of sputtering in the PVD process effectively makes it so that they cannot be used in high aspect ratio because of poor step coverage, and the production of a thick deposition in the opening and a thin deposition in lower part of the via without uniformity and continuity, which causes issues in post electroplating with copper.

Therefore, TSV has a limitation in its performance or structure due to the copper seed layer being thickly formed in the opening with defects in the pad layer and low uniformity in the barrier layer. Existing barrier and copper seed layer forming processes have a limited ability to provide a cost reduction and yield improvement with smaller diameters, lighter weights and reduced size in TSV as well as the reduction of gate lag.

SUMMARY OF THE INVENTION

It is the object of the instant invention to form a copper seed layer applied in forming a through via by a wet method of electroless plating and provide chips with structural uniformity and electrical properties while reducing the process cost with a higher yield.

It is yet another object of the instant invention to perform copper plating in the barrier layer without a copper seed layer to feed a via.

It is yet another object of the instant invention to improve the physical and electrical properties on the post-formed barrier and seed layer of a manufactured chip by activating the surface of the via formed with oxide insulation layer through wet process.

It is yet another object of the instant invention to achieve the stated goals above through the use of a nickel-based barrier layer formed by electroless plating method on the substrate having a via with an insulation layer in it and insulation layer of the via.

It is yet another object of the instant invention to achieve the stated goals above through the use of a cobalt-based barrier layer formed by electroless plating method on the substrate having a via with an insulation layer in it and insulation layer of the via.

The nickel-based layer is composed of Ni, NiB or their combination, and it has 30 or 150 nm of thickness. The cobalt-based layer is composed of Co, Co—W and it has a 30~150 nm of thickness.

The cobalt or nickel barrier layer has 50% or higher step coverage with conductivity $80_u$ Ohm/cm or lower.

An organosilane layer can be included for the enhancement of adhesion between the insulation and barrier layer. The crystal layer can be included for improvement of electroless plating between the insulation and barrier layers.

The pad layer exposed in the insulation layer where the via is extending can be added on the lower part of the substrate. The insulation layer connecting the via can include an opening area including an undercut from the area where the pad is exposed.

The barrier layer can be uniformly formed at the inside of the via including the opening area including the undercut and exposed pad layer.

Metal filling structure of the via by electroplating can be added on the barrier layer.

The invention includes a seed layer that is formed by electroless plating for electroplating of the filling substance of the via on the barrier layer.

The instant invention features the metal filling structure of the via formed by electroplating on the seed layer.

The instant invention includes a method with a preparation stage that cleans and dries the substrate with a via having its insulation layer inside with deionized water ("DIW"); forming a barrier layer to form a nickel-based or cobalt-based barrier layer with ultrasonic electroless plating on the insulation layer inside the via's substrate which was cleaned and dried through the preparation stage; and a cleanup the barrier layer surface to clean and dry with DIW & ultrasonic after the barrier layer forming stage.

The preparation or barrier layer forming stage includes a process that cleans the wafer for several seconds or minutes upon the complete immerse of the substrate in DIW in a vacuum state with 100~01.mbar, and an $N_2$ blanket that dries it.

A cleaning process can be additionally included that cleans the substrate for 10 to 20 seconds with a mixed solution with 10~5 0% peroxide and a sulfuric acid compound on the preparation process.

Vapor-deposition of organosilane with wet ultrasonic and ultrasonic cleaning process for enhancement of adhesion on the insulation layer inside the via in the substrate is additionally included.

The vapor-deposition of organosilane may include the process of inserting a mixed solution of 0.1~10% of silane on dimethyl sulfoxide (DSMO) to a cell, maintaining 30~80 degrees C. to provide ultrasonic vibration, applying the substrate on the cell and recollecting it.

The conditions for providing the ultrasound should have a conductivity of 2~8 ms/cm, a frequency of 15~55 KHz and an energy of 5~30 W/L. The pH should be in the range of 1.0~4.0 in the provided ultrasonic solution.

The metal filling stage of the via with electroplating process with the barrier layer of the substrate as electrode after the barrier layer cleanup process is additionally included.

The seed forming stage to form a metal seed layer with ultrasonic electroless plating on the barrier layer of the substrate after the barrier cleanup stage and seed layer cleanup stage to clean and dry the substrate with DIW formed with the seed layer are additionally included.

The metal filling stage of the via with electroplating process with the seed layer of the substrate as electrode after the seed layer cleanup stage can be additionally included.

The seed layer forming stage may include the process of inserting a mixed solution with 10~50 g/L of ethylenediaminetetraacetic acid (EDTA), 0.5~1.0 g/L of polypropylene glycol (PEG), 10~50 g/L, glyoxylic acid and 10~50 mg/L of bipyridyl on copper sulfate (CS) to a cell, maintaining 30~80 degrees C. to provide an ultrasonic vibration with the constant circulation of the solution, applying the substrate on the cell and recollecting it.

The ultrasound may be provided with a frequency of 15~55 KHz and energy of 5~30 W/L.

The instant invention can meet both performance and economic goals by providing structural uniformity, an improvement of electrical properties, a reduction in cost and an enhancement in yield by forming the barrier layer with an electroless plating wet process applied in forming through via. The instant invention provides an outstanding effect to enable the formation of TSV with smaller diameter for the opening with good reliability. Direct application of copper plating by skipping the formation of copper seed layer is possible, which reduces the number of steps in the process which provides an enhancement of electrical properties by single time charging through the copper plating inside the via if necessary.

The instant invention enables the formation of TSV with smaller diameter for the opening with good reliability.

The instant invention can activate the surface of via formed with oxide insulation layer with multiple wet processes to selectively improve the physical and electrical properties on the post-formed barrier and seed layer to enhance the performance of TSV dramatically.

The instant invention can get a wafer with a comparatively smaller number of cells having a via with insulation layer processed with a simple wet process and perform a mass production for wafers with TSV structure completed before the copper plating process with fast production speed and low cost.

The preferred embodiment of the present invention teaches a semiconductor apparatus comprising: a substrate having through silicon via; an insulation layer; a cobalt-based barrier layer formed with an electroless plating process on said insulation layer of said through silicon via.

The above embodiment can be further modified by defining that said cobalt-based barrier layer has a thickness of 30 to 150 nm and is made of Co, Co—W or a combination thereof.

The above embodiment can be further modified by defining that there further comprises a barrier layer with a conductivity of $80_\mu$ Ohm/cm or below.

The above embodiment can be further modified by defining that there is an additional organosilane layer for enhancement of adhesion between said insulation and said barrier layer.

The above embodiment can be further modified by defining that there is an additional crystal layer for enhancement of electroless plating between said insulation layer and said barrier layer.

The above embodiment can be further modified by defining that at the lower part of said substrate including said insulation layer there is an exposed pad layer at its lower part wherein said through silicon via is extended.

The above embodiment can be further modified by defining that said insulation layer where said through silicon via is connected further comprises an opening area with undercut on said exposed area of the exposed pad layer.

The above embodiment can be further modified by defining that said barrier layer including said opening area with undercut includes uniform formation at the inner side of said through silicon via including said exposed pad layer.

The above embodiment can be further modified by defining that the additional inclusion of a metal filling structure of said through silicon via by electroplating on said barrier layer.

The above embodiment can be further modified by defining that there is the additional inclusion of a seed layer with electroless plating for electroplating of a filling substance of said through silicon via on said barrier layer.

The above embodiment can be further modified by defining that there is the additional inclusion of a metal filling structure of said through silicon via with electroplating on said seed layer.

An alternate embodiment teaches a method of manufacturing a semiconductor apparatus comprising the steps of: preparing the substrate of said semiconductor apparatus by cleaning and drying said substrate having an insulation layer inside of a through silicon via; forming a cobalt-based barrier with ultrasonic electroless plating on said insulation layer of the inner part of said through silicon via; washing and drying said substrate with ultrasonic deionized water.

The above embodiment can be further modified by defining that said preparing and barrier cleaning steps are conducting at 100~0.1 mbar vacuum state and comprise the additional steps of: completely sinking said substrate into deionized water; cleaning said semiconductor apparatus for several seconds to minutes; injecting $N_2$; and drying said semiconductor apparatus.

The above embodiment can be further modified by defining that said preparing step further comprises using a mixture of peroxides at 10~50% on sulfuric acid to clean said substrate for 10 seconds to 20 minutes.

The above embodiment can be further modified by defining that there is a further step of providing vapor-deposition of organosilane with wet ultrasound process for enhancement of adhesion of said insulation layer inside said through silicon via of said substrate; ultrasound cleaning of said substrate before said barrier layer is formed.

The above embodiment can be further modified by defining that wherein vapor-deposition of the organosilane step injects a mixture of 0.1~10% of silane on DSMO (dimethyl sulfoxide), and the temperature is maintained at 30~80 degrees C. to provide ultrasonic vibration, and said substrate is applied on a cell and recollected.

The above embodiment can be further modified by defining that said ultrasound has a conductivity of 2~8 ms/cm, a frequency of 15~55 KHz and an energy of 5~30 W/L and a pH between 1.0~4.0.

The above embodiment can be further modified by defining that said ultrasonic cleaning process of the substrate further comprises the step of filling a cell with methanol, applying said cell into a tank filled with deionized water, providing ultrasonic vibration and applying it to said substrate for several seconds to minutes.

The above embodiment can be further modified by defining that vapor-deposition of Pd crystal with wet ultrasound process on said insulation layer at the inner side of the through silicon via on the substrate to activate electroless plating of the barrier layer before the barrier layer forming stage and additional activation process of vapor-deposited Pd crystal in another cell.

The above embodiment can be further modified by defining that said Pd crystal vapor-deposition process further comprises filling the mixture of 0.1~10% of hydrochloric acid to deionized water on the cell, applying the Pd powder of 50~2 00 mg/L to provide ultrasonic vibration, applying the substrate on the cell and recollecting it.

The above embodiment can be further modified by defining a further step that is an activation process of the vapor-deposited Pd crystal by applying dimethylamineborane at 300~700 mg/L to provide ultrasonic vibration, applying the substrate on the cell and recollecting it.

The above embodiment can be further modified by defining that at the barrier layer forming stage a mixture of 0.1~20% of citric acid is injected on cobalt chloride plating fluid, maintaining the temperature at 30~80 degrees C. to provide ultrasonic vibration, applying the substrate on the cell and recollecting it.

The above embodiment can be further modified by defining that said cobalt chloride plating fluid is replaced in the barrier layer forming stage with one or more mixture of cobalt sulfate, sodium hypophosphite, sodium gluconic acid and glycine.

The above embodiment can be further modified by defining that the ultrasound has ah frequency of 15~55 KHz and an energy of 5~30 W/L.

The above embodiment can be further modified by defining that the method further comprises the inclusion of a metal filling step for the through silicon via with electroplating with the barrier layer of the substrate as electrode after the barrier cleanup stage.

The above embodiment can be further modified by defining that the process further comprises the step of forming a seed layer with ultrasonic electroless plating on the barrier layer of the substrate after the barrier layer cleanup step.

The above embodiment can be further modified by defining that the process further comprises the step of a metal filling stage of the through silicon via with electroplating of the seed layer of the substrate as electrode after the seed layer cleanup step.

The above embodiment can be further modified by defining that the process further comprises the step of injecting a mixture of 10~50 g/L of EDTA, 0.5~1.0 g/L of PEG, 10~50 g/L of glyoxylic acid and 10~50 mg/L of bipyridyl on 10~50 g/L of copper sulfate, maintaining the temperature at 30~80 degrees C. and a constant circulation of the mixture to provide ultrasonic vibration, applying the substrate on the cell and collecting.

The above embodiment can be further modified by defining that the ultrasound has a frequency of 15~55 KHz and an energy of 5~30 W/L.

BRIEF DESCRIPTION OF THE DRAWINGS

FIG. 1 is an example of a laminated chip structure by traditional TSV.

FIGS. 2A-2G are examples of through via formation by traditional TSV.

FIGS. 3A-3E are examples of semiconductor apparatuses having through silicon via structure through the instant manufacturing method.

FIG. 4 is a partial drawing of a manufactured semiconductor apparatus having through silicon via structure produced according to the embodiment of present invention.

FIG. 5 is a block diagram presenting the process in process toll according to the embodiment of present invention.

FIG. 6 is a flowchart of the clean process according to the embodiment of present invention.

FIG. 7 is a flowchart of the DIW cleaning and drying process according to the embodiment of present invention.

FIG. 8 is a flowchart of the ultrasonic organosilane vapor-deposition process according to the embodiment of present invention.

FIG. 9 is a flowchart of the ultrasonic cleaning process according to the embodiment of present invention.

FIG. 10 is a flowchart of the ultrasonic Pd crystal vapor-deposition process according to the embodiment of present invention.

FIG. 11 is a flowchart of ultrasonic the Pd crystal activation process according to the embodiment of present invention.

FIG. 12 is a flowchart of the electroless barrier layer plating process according to the embodiment of present invention.

FIG. 13 is a flowchart of the electroless seed layer plating process according to the embodiment of present invention.

DETAILED DESCRIPTION OF A PREFERRED EMBODIMENT

Turning to the drawings, the preferred embodiment is illustrated and described by reference characters that denote similar elements throughout the several views of the instant invention.

The preferred embodiment of the instant invention is illustrated in detail in the attached drawings and embodiments.

Firstly, FIG. 3A or 3E present semiconductor apparatuses utilizing through silicon via structure's manufacturing method. From this, the substrate structure in FIG. 3A is identical to the one in FIG. 2 with the previously given example with the traditional technology.

As shown by the figure, it is an example of via last process to form a TSV on a chip that is composed of a silicon substrate (31), an insulation layer (32), a pad layer (33) and an insulation layer (34). From the given example, the insulation layers (32, 34) are dielectric layers with a silicon oxide film ($SiO_2$) and the pad layer (33) is a metal electrode to be connected with the TSV to be formed.

FIG. 3B illustrates an exposure of the lower part of insulation layer (32) in constructing a hole or trench-shaped via with high aspect ratio on silicon substrate (31) through DRIE process or a UV laser.

FIGS. 3A and 4B can be implemented through traditional ordinary TSV process.

FIG. 3C applies selective wet etching process on an oxide insulation layer (32) to the via of the structure formed in FIG. 3B, processes wet etching on the insulation layer (32) at the lower part of the via and safely exposes its lower insulation layer (33). In this process, undercut occurs in the upper insulation layer (32), but this enhances the electrical connectivity and physical ruggedness between the post-formed TSV and pad layer (33).

FIG. 3D prepares an insulation layer (35) by forming silicon oxide film ($SiO_2$) with chemical vapor-deposition method on the side of the via which is used as the dielectric layer for electrical insulation from the filling substance of the via after forming the via to pad layer (33) as above. This chemical vapor-deposition generates an insulation layer (35) only on the silicon substrate (31), but not on the exposed pad layer (33) as described.

FIG. 3E presents features of the current invention, which forms a barrier layer (36) with an electroless plating process on the structure formed with undercut as described in FIG. 3D. The barrier layer (36) is reliably formed with uniform thickness and high step coverage on the via with undercut with complexity and high aspect ratio.

The barrier layer (36) uses either Ni and NiB as substances or Co and Co—W which is different from PVD using Ti and TiN or CVD using Ta, TaN. It applies electroless plating process for uniform formation and forms 30~150 nm of thickness through the process adding ultrasonic vibration at appropriate temperature and pH.

Current TSV diameters are formed in single digits~three digit/μm, and uniform formation with extremely thin thickness is possible and 30~150 nm of membrane structure is possibly provided with sufficient blocking feature to prevent diffusion of the filling metal in via to silicon substrate.

This means that extremely low conductivity is possible compared to existing Ti or Ta type barrier layers. For example, the existing TiN(PVD) normally used in the current provides conductivity at the degree of 100~250$_u$ Ohm/cm and TaN(CVD) provides conductivity at the degree of 100~250$_u$ Ohm/cm. However, the NiB or Co—W according to the embodiment of current invention provides 20~80$_u$ Ohm/cm. In other words, an improvement of 20%~1000% in conductivity can be made and this enables dramatic enhancement of the performance of TSV.

The Ni and NiB barrier layer and the Co and Co—W layer with electroless plating process formed by the instant invention provides higher adhesiveness compared to the existing sputtering or chemical vapor deposition. The plating is performed under ultrasonic conditions with higher uniformity and at least 50% of step coverage and half of less stress than the existing process to provide high reliability.

Providing a uniform barrier layer on via with high aspect ratio means the barrier layer can be used as electrode for electroplating without a seed layer to be used in electroplating of filling metal of via. In other words, the barrier layer according to the embodiments in current invention is used now as an electrode for post-electroplating and can reliably form a metal filling structure (e.g. Cu Fill) to fill the via without a separate seed layer.

Naturally, more seed layers can be formed with the identical ultrasonic electroless plating on the barrier layer. In this case, the uniformity and quality of the seed layer increases and this enables enhancement of the performance of TSV by uniform formation of metal filling structure to fill the via with electroplating without electrode.

FIG. 4 is a drawing of the part of the actually manufactured semiconductor apparatus having through silicon via structure. SiO2 insulation layer (35) on silicon substrate (31) and NiB or Co or Co—W barrier layer with electroless plating (36) at 50 nm of thickness on the insulation layer are presented.

Superior step coverage and uniform thickness of 50 nm on the top and side are presented.

Therefore, none of occurrence of the issues in existing dry process due to poor step coverage and non-uniform thickness is found. The equipment cost in this process is significantly lower than dry process due to the comparatively simple process of wet process with fewer processes, thereby enabling cost reduction and an increase in yield.

FIG. 5 is a block diagram (100) presenting the process according to the embodiment of present invention. The block diagram includes a total of 12 cell blocks defining the steps in performing the formation of seed layer as described. It is composed of total of 10 cell blocks in performing the formation of barrier layer excepting the production of the seed layer.

Firstly, the insulation layer inserts a cassette with silicon substrate having via formed in the inside to wet process equipment through front opening unified pod ("FOUP") (101).

The silicon substrate goes under pre-wet and drying process with DIW in cell 1 (111) and clean process removes containments. The cell 1 and 2 may be omitted but if applied, various contaminants that may be found on the substrate before electroless plating are effectively removed.

After this, basic preparation is ready for actual electroless plating through recleaning with DIW, inserting $N_2$ and drying of the substrate at cell 3 (113). Then, ultrasonic electroless barrier lamination may be done in cell 9 (119), but the process to activate the insulation layer inside of the via can be additionally done through cell 4 (114) or cell (118) to increase the efficiency of this electroless barrier lamination.

Ultrasonic organosilane deposition is performed by applying the substrate on cell 4 (114) after cleaning and drying it through cell 3 (113). This ultrasonic organosilane deposition is performed to increase the adhesion of barrier layer to be plated under appropriate temperature condition and the vapor-deposition provides ultrasonic vibration to increase the degree of uniformity of the organosilane.

An organosilane layer is formed on the inner wall of the insulation layer of the via and then the substrate is cleaned through ultrasonic cleaning process at cell 5 (115) and deposition is performed with palladium (Pd) crystal through wet ultrasonic process at the inner part of via where the organosilane is formed at cell 6 (116).

Then, cell 7 (117) activates the palladium crystal layer.

When the palladium crystal is formed at the inner side of the via where the barrier is to be plated and activated with separate processes, the palladium crystal works as a catalyst and the electroless barrier plating efficiency and properties are improved.

After that, the substrate is cleaned and dried with DIW at cell 8 (118) to prepare the actual ultrasonic electroless barrier plating process.

Performing two stages of the process activating the insulation layer at the inner side of via before performing actual electroless barrier plating enables to provide a barrier layer with improvements in all elements, which determines the performance of TSV, such as the barrier's degree of uniformity, electrical properties, step coverage, stress, adhesion, etc.

The barrier layer's thickness is only 30~150 nm and the organosilane layer or Pd crystal layer is minutely formed at the surface of the insulation layer inside via and this is understood to not be a process to form a separate layer but a plated side activation process. Each of the actual processes takes only several minutes to a couple of dozen minutes and is considered as one preparation process to form a barrier, which need not be classified as a sperate membrane stage.

The cell 9 (119) forms a barrier at 30~150 nm thickness with electroless plating with Ni, NiB, Co or Co—W or a combination thereof by maintaining the appropriate temperature with ultrasonic vibration on the activated substrate for plating. Naturally, decreasing or increasing thickness is possible.

Because this formation of barrier layer enables having metal layers of via through electroplating, it directly proceeds to cell 12 (120) to clean and dry the substrate and recollects the cassette where the silicon substrate is located from the wet process equipment through wafer carrier (102) in the process.

If the aim is to form more seed layers, the substrate formed barrier layer through cell 9 (119) can be delivered to cell 10 (131) to proceed electroless seed layer plating on the barrier layer. For instance, uniform formation in seed layer can be induced by applying ultrasonic vibration during electroless copper seed layer plating. Then, the formed silicon substrate that is cleaned and dried at cell 12 (120) to seed layer through wafer carrier (102) in the process can be recollected.

And then, the via can be filled in uniform condition without gaps by plating Cu and other metals with electroplating process with the barrier or seed layer as electrode to optimize the performance of TSV.

FIG. 6 or 13 are examples of the condition in process for each cell explained in FIG. 5. The volume of cell is 1,000 ml in the premise, this presents deposition of NiB or Co—W barrier layer with electroless plating is performed on the insulation layer of the inner via and the process of electroless plating of Cu seed layer on the barrier layer selectively.

FIG. 6 is a flowchart of the clean process according to the embodiments of the current invention and includes the process preparing 10~50% of hydrogen peroxide type compound on sulfuric acid type compound, completely sinking the substrate into the compound for 10 seconds to 20 minutes and recollecting the wafer.

The compound may be replaced with the mixed compound of hydrochloric acid and hydrogen peroxide or sulfuric acid and hydrogen peroxide.

FIG. 7 is a flowchart of the cleaning and drying process with DIW according to the embodiments of current invention. As described, it has 100~0.1 mbar vacuum state, inserts DIW and sink the substrate on the DIW, cleans the wafer from several seconds to minutes, recollects the wafer and dries it by blowing $N_2$.

FIG. 8 is a flowchart of ultrasonic organosilane deposition process according to the embodiments of current invention. It includes the process of mixing silane at 0.1~10% to DSMO (Dimethyl Sulfoxide), maintaining the temperature at 30~80 degrees C., providing ultrasonic vibration, completely sinking substrate on the cell for several seconds to minutes (e.g. about 10 minutes) and recollecting it.

From this, the ultrasound provided as above should have a conductivity of 2~8 ms/cm, a frequency of 15~55 KHz, an energy of 5~30 W/L and the pH of solution where the ultrasound is provided should be the set value between 1.0~4.0, FIG. 9 is a flowchart of ultrasonic cleaning process according to the embodiment of present invention. To completely clean the substrate after the ultrasonic organosilane process, it fills the cell with methyl alcohol, applies it to a tank filled with DIW to provide ultrasonic vibration, completely sinks the substrate on the cell, keeps it several seconds to minutes and recollects it. In this case, the ultrasound may be provided with a frequency of 15~55 KHz and an energy of 5~30 W/L as well.

FIG. 10 is a flowchart of ultrasonic Pd crystal deposition process according to the embodiment of present invention. It includes the process filling a cell with the solution with 0.1~10% of hydrochloric or similar acids to DIW, providing ultrasonic vibration after applying 50~200 mg/L of Pd powder (Palladium (11)), completely sinking the substrate on the cell and recollecting it after several seconds to minutes.

FIG. 11 is a flowchart of ultrasonic Pd crystal activation process according to the embodiment of present invention, it includes the process mixing 300~700 mg/L of DMAB (dimethylamineborane) to DIW to apply, providing ultrasonic vibration, applying substrate on the cell and collecting it after several seconds to minutes.

Acetoin, dimethylamineborane, glycine, acetol or other modifiers may replace the dimethylamineborane.

FIG. 12 is a flowchart of electroless barrier layer plating process according to the embodiment of present invention. It includes the process mixing 0.1~20% of citric acid to nickel sulfate to inject, providing ultrasonic vibration at 30-80 degrees of temperature, completely sinking substrate on the cell and collecting it after a minute to several minutes.

The plating fluid used in electroless plating for the nickel film can include nickel sulfate, sodium hypophosphite, sodium gluconic acid and glycine. The plating fluid in electroless plating for cobalt film can use cobalt chloride, malic acid and glycine.

The citric acid can be replaced by tartaric acid, malic acid, oxalic acid, succinic acid, lactic acid, etc.

Maintaining pH at set value between 6.0~10.0 though methylethanolamine is recommended during the process. In here, methylethanolamine may be replaced by amines, glycols, glycol ethers, polyglycol ethers or the combination as common solvent of the group with two or more of same.

Maintaining 15~55 KHz of frequency and 5~30 W/L of energy for the ultrasonic to be provided in the process is recommended.

FIG. 13 is a flowchart of the electroless seed layer plating process according to the embodiment of present invention. It includes injecting the mixture of 10~50 g/L of EDTA (ethylenediaminetetraacetic acid, 0.5~1.0 g/L of PEG (polypropyleneglycol), 10~50 g/L of glyoxylic acid, 10~50 mg/L of bipyridyl to 10~50 g/L of copper sulfate to a cell, maintaining 30~80 degrees C. of temperature and constant circulation of the mixture to provide ultrasonic vibration, completely sinking substrate on the cell and recollecting it after a minute to 20 minutes. In this case, the ultrasound is recommended to be provided with frequency of 15~55 KHz and energy of 5~30 W/L as well.

In here, the copper sulfate plating fluid, EDTA plating fluid may be replaced with similar type of other plating fluids, PEG may be replaced with a surfactant such as block copolymer or polypropyleneglycol, the glyoxylic acid may be replaced with similar reducers, the bipyridyl may be replaced with corrosion inhibitor such as benzene triazole, caffeine, theophiline, bipyridyl or triazole.

While this invention has been described in connection with what is presently considered to be practical exemplary embodiments, it is understood that the invention is not limited to the disclosed embodiments, but on contrary, is intended to cover various modifications and equivalent arrangements by a person of ordinary skill in the art to which the inventions pertain within the spirit and scope of the appended claims.

The invention illustratively disclosed herein suitably may be practiced in the absence of any element which is not specifically disclosed herein.

The discussion included in this patent is intended to serve as a basic description. The reader should be aware that the specific discussion may not explicitly describe all embodiments possible and alternatives that are implicit. Also, this discussion may not fully explain the generic nature of the invention and may not explicitly show how each feature or element can actually be representative or equivalent elements. Again, these are implicitly included in this disclosure. Where the invention is described in device-oriented terminology, each element of the device implicitly performs a function. It should also be understood that a variety of changes may be made without departing from the essence of the invention. Such changes are also implicitly included in the description. These changes still fall within the scope of this invention.

Further, each of the various elements of the invention and claims may also be achieved in a variety of manners. This disclosure should be understood to encompass each such variation, be it a variation of any apparatus embodiment, a method embodiment, or even merely a variation of any element of these. Particularly, it should be understood that as the disclosure relates to elements of the invention, the words for each element may be expressed by equivalent apparatus terms even if only the function or result is the same. Such equivalent, broader, or even more generic terms should be considered to be encompassed in the description of each element or action. Such terms can be substituted where desired to make explicit the implicitly broad coverage to which this invention is entitled. It should be understood that all actions may be expressed as a means for taking that action or as an element which causes that action. Similarly, each physical element disclosed should be understood to encompass a disclosure of the action which that physical element facilitates. Such changes and alternative terms are to be understood to be explicitly included in the description.

What is claimed is:

1. A semiconductor apparatus comprising:
 a substrate having through silicon via;
 an insulation layer;
 a cobalt-based barrier layer formed with an electroless plating process on said insulation layer of said through silicon via wherein there further comprises a barrier layer with a conductivity of $80_u$ Ohm/cm or below and wherein there is an additional organosilane layer for enhancement of adhesion between said insulation and said barrier layer.

2. The semiconductor apparatus as defined in claim 1 wherein said cobalt-based barrier layer has a thickness of 30 to 150 nm and is made of Co, Co—W or a combination thereof.

3. The semiconductor apparatus as defined in claim 1 wherein there is an additional crystal layer for enhancement of electroless plating between said insulation layer and said barrier layer.

4. The semiconductor apparatus as defined in claim 1 further comprising at the lower part of said substrate including said insulation layer there is an exposed pad layer at its lower part wherein said through silicon via is extended.

5. The semiconductor apparatus as defined in claim 4 wherein said insulation layer where said through silicon via is connected further comprises an opening area with undercut on said exposed area of the exposed pad layer.

6. The semiconductor apparatus as defined in claim 5 wherein said barrier layer including said opening area with undercut includes uniform formation at the inner side of said through silicon via including said exposed pad layer.

7. The semiconductor apparatus as defined in claim 1 further comprising the additional inclusion of a metal filling structure of said through silicon via by electroplating on said barrier layer.

8. The semiconductor apparatus as defined in claim 1 wherein there is the additional inclusion of a seed layer with electroless plating for electroplating of a filling substance of said through silicon via on said barrier layer.

9. The semiconductor apparatus as defined in claim 8 wherein there is the additional inclusion of a metal filling structure of said through silicon via with electroplating on said seed layer.

10. A method of manufacturing a semiconductor apparatus comprising the steps of:
 preparing the substrate of said semiconductor apparatus by cleaning and drying said substrate having an insulation layer inside of a through silicon via;
 forming a cobalt-based barrier with ultrasonic electroless plating on said insulation layer of the inner part of said through silicon via;
 washing and drying said substrate with ultrasonic deionized water wherein said preparing and barrier cleaning steps are conducting at 100~0.1 mbar vacuum state and comprise the additional steps of:
 completely sinking said substrate into deionized water;
 cleaning said semiconductor apparatus for several seconds to minutes;
 injecting $N_2$;
and drying said semiconductor apparatus.

11. The method as defined in claim 10 wherein said preparing step further comprises using a mixture of peroxides at 1050% on sulfuric acid to clean said substrate for 10 seconds to 20 minutes.

12. The method as defined in claim 10 further comprising the step of;
 providing deposition of organosilane with wet ultrasonic process for enhancement of adhesion of said insulation layer inside said through silicon via of said substrate;
 ultrasonic cleaning of said substrate before said barrier layer is formed.

13. The method as defined in claim 12 wherein deposition of the organosilane step injects a mixture of 0.1~10% of silane on DSMO (dimethyl sulfoxide), and the temperature is maintained at 30~80 degrees C. to provide ultrasonic vibration, and said substrate is applied on a cell and recollected.

14. The method as defined in claim 12 wherein said ultrasonic has a conductivity of 2~8 ms/cm, a frequency of 15~55 KHz and an energy of 5~30 W/L and a pH between 1.0~4.0.

15. The method as defined in claim 12 wherein said ultrasonic cleaning process of the substrate further comprises the step of filling a cell with methanol, applying said cell into a tank filled with deionized water, providing ultrasonic vibration and applying it to said substrate for several seconds to minutes.

16. The method as defined in claim 10 wherein deposition of Pd crystal with wet ultrasonic process on said insulation layer at the inner side of the through silicon via on the substrate to activate electroless plating of the barrier layer before the barrier layer forming stage and additional activation process of deposited Pd crystal in another cell.

17. The method as defined in claim 16 wherein said Pd crystal deposition process further comprises filling the mixture of 0.1~10% of hydrochloric acid to deionized water on the cell, applying the Pd powder of 50~200 mg/L to provide ultrasonic vibration, applying the substrate on the cell and recollecting it.

18. The method as defined in claim 16 further comprising an activation process of the deposited Pd crystal by applying dimethylamineborane at 300~700 mg/L to provide ultrasonic vibration, applying the substrate on the cell and recollecting it.

19. The method as defined in claim 16 where at the barrier layer forming stage a mixture of 0.1~20% of citric acid is injected on cobalt chloride plating fluid, maintaining the temperature at 30~80 degrees C. to provide ultrasonic vibration, applying the substrate on the cell and recollecting it.

20. The method as defined in claim 19 wherein said cobalt chloride plating fluid is replaced in the barrier layer forming stage with one or more mixture of cobalt sulfate, sodium hypophosphite, sodium gluconic acid and glycine of claim 19.

21. The method as defined in claim 19 wherein the ultrasound has ah frequency of 15~55 KHz and an energy of 5~30 W/L.

22. The method as defined in claim 10 further comprising the inclusion of a metal filling step for the through silicon via with electroplating with the barrier layer of the substrate as electrode after the barrier cleanup stage.

23. The method as defined in claim 10 further comprising the step of forming a seed layer with ultrasonic electroless plating on the barrier layer of the substrate after the barrier layer cleanup step.

24. The method as defined in claim 23 further comprising the step of a metal filling stage of the through silicon via with electroplating of the seed layer of the substrate as electrode after the seed layer cleanup step.

25. The method as defined in claim 23 further comprising the step of injecting a mixture of 10~50 g/L of EDTA, 0.5~1.0 g/L of PEG, 10~50 g/L of glyoxylic acid and 10~50 mg/L of bipyridyl on 10~50 g/L of copper sulfate, maintaining the temperature at 30~80 degrees C. and a constant circulation of the mixture to provide ultrasonic vibration, applying the substrate on the cell and collecting.

26. The method as defined in claim 25 wherein the ultrasound has a frequency of 15~55 KHz and an energy of 5~30 W/L.

* * * * *